United States Patent
Yang

(10) Patent No.: US 7,514,743 B2
(45) Date of Patent: Apr. 7, 2009

(54) DMOS TRANSISTOR WITH FLOATING POLY-FILLED TRENCH FOR IMPROVED PERFORMANCE THROUGH 3-D FIELD SHAPING

(76) Inventor: Robert Kuo-Chang Yang, 185 Estancia Dr., Apt. #355, San Jose, CA (US) 95134

( * ) Notice: Subject to any disclaimer, the term of this patent is extended or adjusted under 35 U.S.C. 154(b) by 388 days.

(21) Appl. No.: 11/351,644

(22) Filed: Feb. 9, 2006

(65) Prior Publication Data

US 2007/0052060 A1    Mar. 8, 2007

Related U.S. Application Data

(63) Continuation-in-part of application No. 11/234,519, filed on Sep. 23, 2005.

(60) Provisional application No. 60/711,050, filed on Aug. 23, 2005.

(51) Int. Cl.
    *H01L 29/40* (2006.01)
(52) U.S. Cl. .................. 257/330; 257/328; 257/329; 257/331; 257/E29.257; 257/E29.262
(58) Field of Classification Search ................ 257/302, 257/328, 330, 335, 329, 331, E29.257, E29.262
    See application file for complete search history.

(56) References Cited

U.S. PATENT DOCUMENTS

| | | | |
|---|---|---|---|
| 5,204,545 | A | 4/1993 | Terashima |
| 5,233,215 | A | 8/1993 | Baliga |
| 5,334,546 | A | 8/1994 | Terashima |
| 6,246,101 | B1 | 6/2001 | Akiyama |
| 6,362,505 | B1 * | 3/2002 | Tihanyi ....................... 257/329 |
| 6,410,958 | B1 * | 6/2002 | Usui et al. .................. 257/329 |
| 6,452,230 | B1 | 9/2002 | Boden, Jr. |
| 6,608,350 | B2 | 8/2003 | Kinzer et al. |
| 6,710,403 | B2 * | 3/2004 | Sapp ........................... 257/330 |
| 6,774,434 | B2 | 8/2004 | Hueting et al. |
| 6,774,734 | B2 | 8/2004 | Christensen et al. |
| 6,803,626 | B2 | 10/2004 | Sapp et al. |
| 6,991,977 | B2 | 1/2006 | Kocon |

(Continued)

OTHER PUBLICATIONS

B. Elattari et al., "Impact of Charging on Breakdown in Deep Trench Isolation Structures", European Solid-State Device Research, 2003, pp. 513-516.

(Continued)

*Primary Examiner*—A. Sefer
*Assistant Examiner*—Eduardo A Rodela
(74) *Attorney, Agent, or Firm*—Patent Law Group LLP; Brian D. Ogonowsky

(57) ABSTRACT

One or more vertical DMOS transistors, such as trench FETS, are formed between opposing floating poly-filled trench portions. The opposing trench portions may include two parallel trenches, rectangular trenches, hexagonal trenches, octagonal trenches, circular trenches, or other shapes. The floating trench portions are capacitively coupled to assume a potential somewhere between the high drain voltage (below the trenches) and the body voltage (near the top of the trenches). The floating trench portions will have a potential below the drift region and deplete the drift region. The depletion regions caused by the opposing trench portions will merge under the gate with a sufficiently high drain voltage. The electric field lines in the drift region will be shaped to increase the breakdown voltage of the device.

30 Claims, 9 Drawing Sheets

U.S. PATENT DOCUMENTS 7,126,187 B2 * 10/2006 Aoki et al. .................. 257/330
2005/0156232 A1 7/2005 Hueting et al.

OTHER PUBLICATIONS

Yung C. Liang et al., "Oxide-Bypassed VDMOS (OBVDMOS): An alternative to Superjunction High Voltage MOS Power Devices," IEEE Electron Devices Letters, vol. 22, No. 8, Aug. 2001, pp. 407-409.

Yung C. Liang et al., "Tunable Oxide-Bypassed VDMOS (OBVDMOS): Breaking the Silicon Limit for the Second Generaton," 2002 IEEE, pp. 201-204.

Xin Yang et al., "Tunable Oxide-Bypassed Trench Gate MOSFET: Breaking the Ideal Superjunction MOSFET Performance Line at Equal Column Width," IEEE Electron Device Letters, vol. 24, No. 11, Nov. 2003, pp. 704-706.

Hidefumi Takaya et al., Floating Island and Thick Bottom Oxide Trench Gate MOSFET (FITMOS), Proceedings of the 17th International Symposium on Power Semiconductor Devices & IC's, May 23-26, 2005, Santa Barbara, CA pp. 43-46.

R.Van Dalen et al., "Breaking the Silicon limit using semi-insulating Resurf layers," Proceedings of 2001 International Symposium on Power Semiconductor Devices & IC's, Osaka, pp. 391-394.

Andy Strachan et al., "A Trench-Isolated Power BiCMOS Process with Complimentary High Performance Vertical Bipolars," paper, Advanced Process Technology Development, National Semiconductor, Santa Clara, CA, 4 pages.

V. Parthasarathy et al., "A 0.25μm CMOS based 70V smart power technology with deep trench for high-voltage isolation," 2002 IEEE, pp. 459-462.

* cited by examiner

DMOS TRANSISTOR WITH FLOATING POLY-FILLED TRENCH FOR IMPROVED PERFORMANCE THROUGH 3-D FIELD SHAPING

CROSS-REFERENCE TO RELATED APPLICATIONS

This application claims the benefit of provisional application 60/711,050, filed Aug. 23, 2005, entitled "DMOS Transistor With Floating Poly-Filled Trench For Improved Performance Through 3-D Field shaping".

This application is also a continuation-in-part of application Ser. No. 11/234,519, filed Sep. 23, 2005, entitled "DMOS Transistor With A Poly-Filled Deep Trench For Improved Performance," incorporated herein by reference.

FIELD OF THE INVENTION

This invention relates to vertical double-diffused metal-oxide-semiconductor (DMOS) transistors and, in particular, to forming floating poly-filled trenches proximate to vertical DMOS transistors for improved performance of the DMOS transistors, including increased breakdown voltage.

BACKGROUND

The main challenge for power semiconductor devices is to achieve low on-resistance in the conduction mode and high sustaining voltage (or breakdown voltage) in the blocking mode. However, lower on-resistance can only be accomplished with a tradeoff in breakdown voltage (or vice versa) by using lower resistivity material in the drift region. In fact, doubling the breakdown voltage of a power semiconductor device typically results in as much as a five-fold increase in the on-resistance.

Much research has been done on super-junction, floating islands, and Oxide-Bypassed techniques to improve power device performance, but the need for an innovative and easy-to-manufacture technique to further increase the breakdown voltage without sacrificing on-resistance still remains.

For power semiconductor devices, low breakdown is usually caused by field bunching at some location such as at a junction curvature, device edge, or other corners. U.S. Pat. Nos. 5,204,545 and 5,334,546 to Terashima teach a technique of spreading electric field through multiple floating field plates by capacitive coupling to reduce field concentration. However, the technique is limited to a planar effect where electric field lines get spread out along the junction surface. Further, U.S. Pat. No. 6,246,101 to Akiyama and U.S. Pat. No. 5,233,215 to Baliga demonstrate the use of an isolation or termination structure at the device edge to improve breakdown voltage by spreading electric field lines in the isolation/termination structure, which contains numbers of floating field plates. It should be noted that all of these involve a field spreading technique at the device edge or termination, but not in active device region, where electric field lines remain crowded.

More recently, an Oxide-Bypassed technique has been developed to shape the electric field in the drift region. U.S. Pat. No. 6,452,230 (Boden), U.S. Pat. No. 6,608,350 (Kinzer et al.), and U.S. Pat. No. 6,774,434 B2 (Hueting et al.) are examples of this Oxide-Bypassed technique, with a field shaping region (e.g., poly in an oxide lined trench) physically connected to source metal, and in some cases to a drain electrode. The voltage along the poly is thus fixed. One of the main disadvantages is that the dielectric that separates the field-shaping region and the drift region has to be relatively thick in order to sustain the higher electric field in the dielectric (e.g., 3x for $SiO_2$ than Si), which in turn increases cell pitch and reduces specific on-resistance. If the field-shaping region is physically connected to both the source and the drain, the device has to live with same level of leakage in the blocking state, which may not be tolerable for some applications.

SUMMARY

Vertical DMOS transistor performance is significantly improved by the technique discussed herein.

In a vertical DMOS, current flows downward from a source region to a drain region rather than laterally. Vertical DMOS transistors include trench FETS, where the gate is formed in a trench, as well as DMOS transistors where the gate is overlying the substrate surface. The term TDMOS will be sometimes used to designate a trench FET, and the term VDMOS will be sometimes used to designate a DMOS with a gate overlying the top of the substrate.

In a DMOS transistor, a gate potential controls the conductivity of a channel region between a source region and a lightly doped drain drift region. The channel region is the area in a body region (of a conductivity type opposite that of the source and drift regions) where the conductivity type becomes inverted with a sufficient gate potential, causing current to flow between the source and drift regions. For a high power device, the drift region is typically an epitaxial layer formed over a highly doped drain region (e.g., an N+ substrate).

In one embodiment, the present technique utilizes two opposing floating poly-filled trenches, with the DMOS transistor in-between. An oxide liner insulates the poly from the DMOS regions. The poly in each trench assumes a potential, determined by capacitive coupling, somewhere between the drain bias voltage (e.g., 60 volts) and the body bias voltage (e.g., 0 volts). Since the floating poly will have some potential less than the drain bias voltage, this lower potential will impose some degree of depletion in the adjacent drift region. This depletion region will expand both vertically and laterally with an increased drain bias. At a high enough drain voltage, the depletion regions generated by the opposing poly-filled trenches will merge laterally and then continue to expand in the vertical direction. Eventually, the drift region will be completely depleted or pinched. The resulting shaping of the field lines increases the breakdown voltage of the transistor. The increasing of breakdown voltage occurs upon merging of the depletion regions even without substantial vertical depletion of the drift region.

Multiple DMOS transistors connected in parallel can be formed between opposing floating plates for increasing breakdown voltage and reducing on-resistance.

In other embodiments, the DMOS transistors are formed as rectangular, hexagonal, octagonal, or circular cells. The floating trenches may encircle each individual cell or a number of cells. The floating trench portions create merging depletion regions under the gate of each cell to increase the breakdown voltage.

Further improvements are also described.

BRIEF DESCRIPTION OF THE DRAWINGS

Elements labeled with the same numerals in the various figures are the same or similar.

DETAILED DESCRIPTION

Breakdown typically occurs in a vertical DMOS where the electric field lines in the drift region bunch up so as to create a high potential difference over a relatively small portion of silicon. Increasing the breakdown voltage has been achieved by avoiding sharp corners in junctions and by other techniques. The present invention further shapes the field lines in the drift region by using opposing floating trenches, where the potential on the floating trenches depletes the drift region and shapes the field lines to increase the breakdown voltage.

Figure 1:
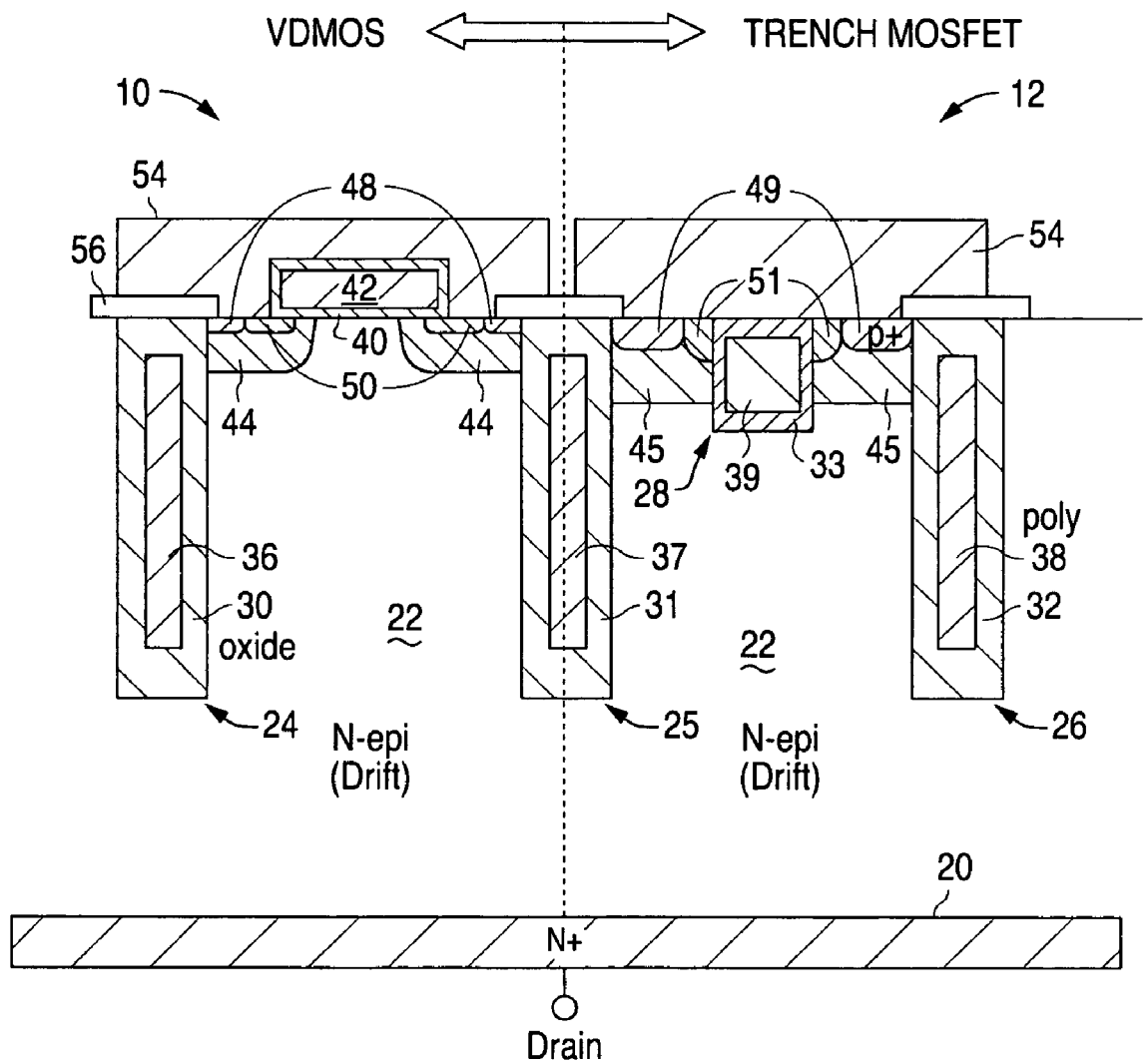
FIG. 1 is a cross-sectional view of opposing floating trenches used with a VDMOS transistor and a TDMOS transistor for increasing the breakdown voltage.

FIG. 1 shows the floating trench technique being applied to both a VDMOS transistor 10, with a gate overlying the substrate surface, and a TDMOS transistor 12, with a vertical gate formed in a trench. Normally, only one type of transistor would be used with a set of floating trenches. In the present example, the DMOS transistors are N-channel types, although the devices can also be formed as P-channel devices where all conductivities are reversed.

In one embodiment, the starting silicon substrate is an N+ type. The bottom surface of the substrate forms an N+ drain contact 20. The N+ drain may also be a buried layer with N+ sinkers connecting the buried layer to top surface drain contacts.

An N– epitaxial layer 22 is grown to a desired thickness, depending on the intended operating voltage of the device. The epitaxial layer 22 acts as a drift region. Alternatively, the substrate may be a lightly doped N-type so that an epitaxial layer need not be grown.

Trenches are then formed in the silicon surface. Deep trenches 24, 25, and 26 are formed for the floating trenches. More shallow trenches 28 are formed for the TDMOS transistors. The trenches are oxidized to form a layer of insulating oxide 30-33 on the walls of the trenches to insulate the subsequently deposited polysilicon from the N-epi 22. The depth of the trenches 24-26 affect the coupling ratio of the floating trenches to the drain voltage and the extent of depletion of the drift region, as will be described later. The optimum physical characteristics of the floating trenches depend on the requirements of the particular DMOS transistor.

The trenches 24-26 and 28 are filled with polysilicon 36-39, respectively. The poly 39 for the gate will be highly doped to create a highly conductive gate that is electrically connected (not shown). The poly 36-38 for the deep trenches 24-26 may be doped or undoped. The poly 36-38 is insulated from all regions of the DMOS transistor and is thus floating. Since there is no current flowing in the floating poly, there is minimal impact on performance if the poly is doped or undoped.

For the VDMOS transistor 10, a very thin gate oxide 40 is formed on the top surface, and a conductive gate 42, such as doped poly, is deposited.

P-type body regions 44 and 45 are formed using the gates to self-align the body regions. P+ body contact regions 48 and 49 are formed to achieve ohmic contact to the body regions. A portion of the body regions 44 and 45 next to the gate forms a channel region. N+ source regions 50 and 51 are formed in the body region.

A threshold voltage applied to the gate 42 or gate/poly 39 will invert the body region next to the gate to create a conductive N-channel through the body region to cause current to be conducted between the sources and the drain. All aspects of forming the transistors, except for the floating trenches, are well known and need not be described in detail.

The floating trenches 24-26 are capacitively coupled to the N-epi 22 (drift region) and body region 44 or 45. The body region is typically biased at 0 volts, and the drain is typically biased at a positive power supply voltage (e.g., 60 volts). Therefore, the floating trenches will assume a potential somewhere between the body voltage and the drain voltage. In one embodiment, the floating trenches will be at a voltage approximately mid-way between the body and drain voltages. Since the floating trenches are at a voltage lower than the N-epi 22 voltage, the floating trenches will deplete the area of the N-epi 22 between the opposing floating trenches and change the electric field lines, as will be described with respect to FIG. 3.

The most important design consideration for the floating trench technique is the drift epi resistivity. It determines not only the specific on-resistance of the device, but also the breakdown voltage, since the epi resistivity affects the capacitive coupling between the drift region and the P-type body to the floating poly. The potential on the floating trench with respect to the drift region sets the depletion width in the drift region, which is a function of the degree of field shaping.

Other important design parameters include trench depth, epi thickness, distance between field-shaping regions (floating trenches), thickness of trench dielectric, and vertical overlapping distance between the floating poly and the P-type diffused body regions. The various factors affect the coupling ratio and the effect of the floating trenches on the drift region. Optimum parameters may be determined by simulation based on the requirements of the transistor.

Higher breakdown voltage and lower on-resistance can be achieved with a multi epi-layer approach, with either a stepped or gradual doping profile.

Given the fact that the VDMOS transistor 10 channel is on the surface under the planar poly gate 42, instead of adjacent a trench sidewall, the P-body region 44 is relatively shallow. This shallow P-type junction may pose some difficulty for establishing adequate coupling to the floating trenches, leading to too high of a potential on the floating trenches, much closer to the drain voltage. This will defeat the field shaping effect where not enough depletion is imposed in the drift region. This problem, however, can be overcome with the aid of source/p-body metal 54, shown in FIG. 1. Here, the total dielectric 56 thickness between the source/p-body metal 54 and the floating trenches would be the primary parameter in determining the coupling ratio.

The TDMOS transistor 12 can also benefit from the source/p-body metal 54. For devices operating in voltage range between 60-100V, ~30% of on-resistance is contributed to channel resistance, and the remaining ~70% to resistance in the drift region. Source metal improves coupling of the floating trench to the lowest potential in the device. This allows doping in the P-body region to be low and just sufficiently doped to suppress source-drain punch through leakage, which reduces channel resistance in the on-state.

Figure 2:
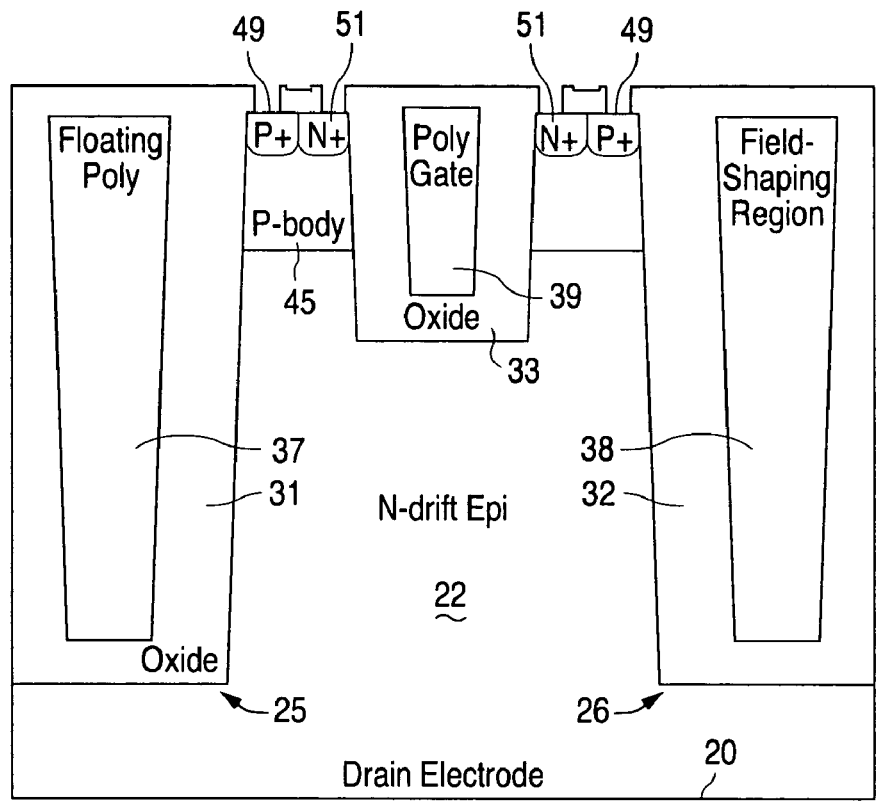
FIG. 2 is a cross-sectional view of an embodiment of the invention used in a computer simulation.

FIG. 2 is a cross-section of a TDMOS transistor similar to transistor 12 in FIG. 1, and similar components are identified with the same numerals. The device of FIG. 2 was used to simulate the effect of the floating trenches. The N+ substrate portion begins at the bottom of FIG. 2.

The dimensions of the transistor in FIG. 2 are to scale. The trench spacing is about 1.5 microns, and the trenches are about 2.5 microns deep. The size and spacing of the trenches depend on the layout of the transistor, the voltage rating of the transistor, and the thickness of the epi layer. The epi layer in FIG. 2 is about 3 microns thick. The required trench oxide thickness depends on the voltage difference between the trench poly and the drift region or body region.

Figure 3:
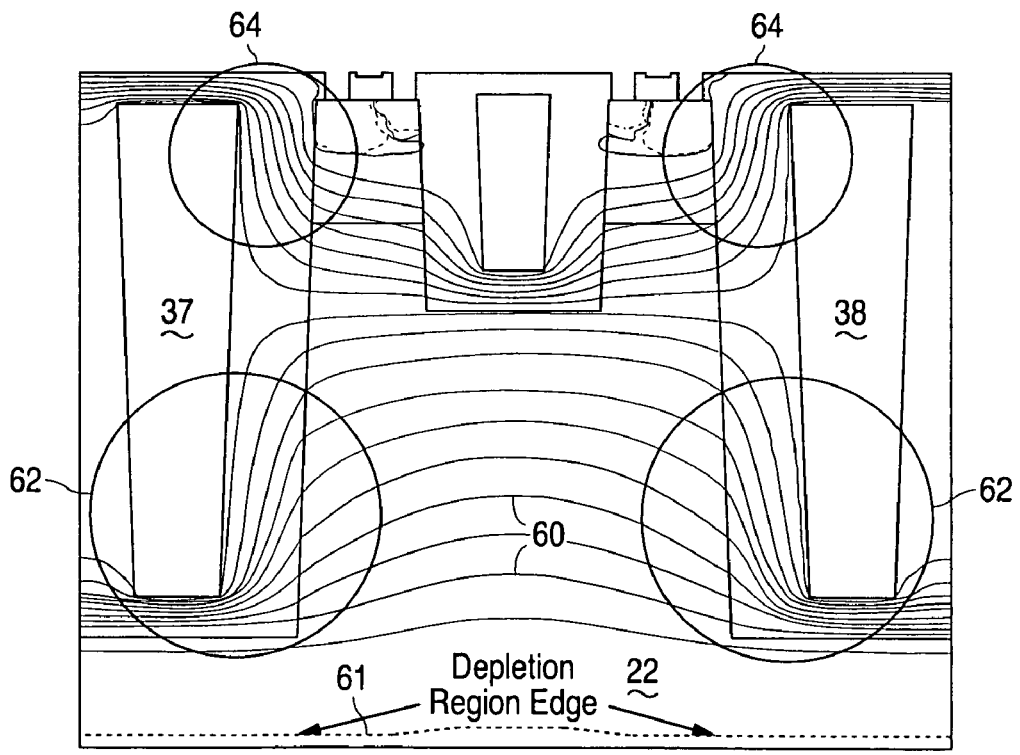
FIG. 3 shows the shaping of field lines by the floating trenches in FIG. 2 to increase the breakdown voltage.

FIG. 3 shows the electric field lines 60 with a drain voltage of around 60 volts. The depletion regions created by the floating trenches 37 and 38 increase laterally toward the middle of the drift region (epi 22) as the drain voltage is increased until the depletion regions merged (pinch off) and continued to expand vertically. Ultimately, the drift region between the opposing trenches is fully depleted. The depletion region edge 61 is labeled at the bottom of the drift region of FIG. 3.

The fundamental breakdown limitation near a junction is due to the nature of the junction curvature that results in a convex shape of field lines at the junction edge. This convex curvature causes field lines to bunch or concentrate at a region, imposing a limit in breakdown voltage. At a high enough drain bias, the depletion regions from two opposing trenches will first merge laterally, and then continue to expand in the vertical direction. At this point, the n-epi drift region is completed depleted or pinched, and the resultant field lines within drift region become concave instead of convex, as shown in areas 62 in FIG. 3, to increase device breakdown voltage. Further, the field lines are curved around the top of the floating trenches at areas 64 to additionally reduce crowding of the field lines.

Figure 4:
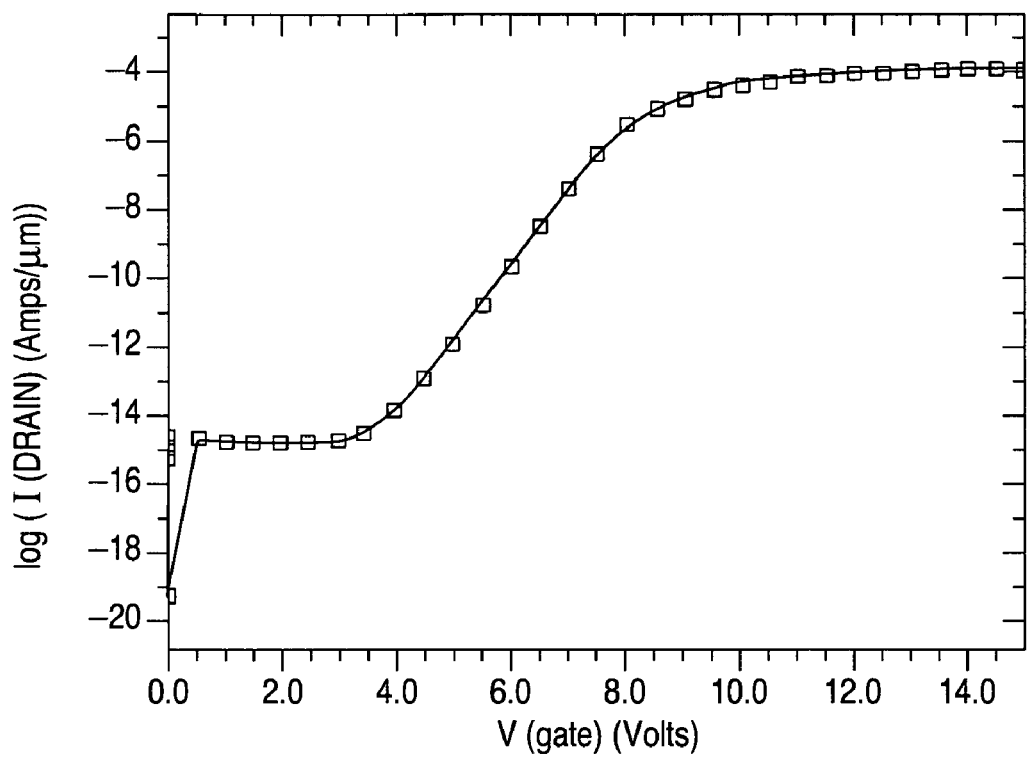
FIG. 4 is a graph of the drain current vs. gate voltage for the simulated device of FIG. 2.
Figure 5:
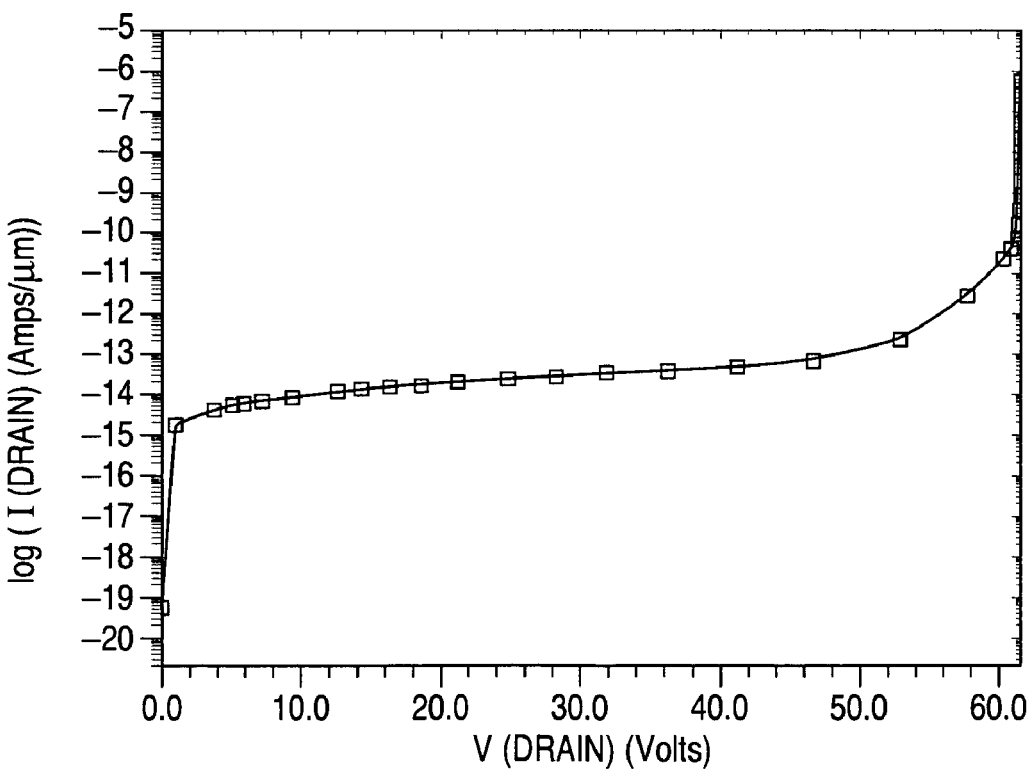
FIG. 5 is a graph of the drain current vs. drain voltage for the simulated device of FIG. 2, showing a breakdown at around 60 volts.
Figure 6:
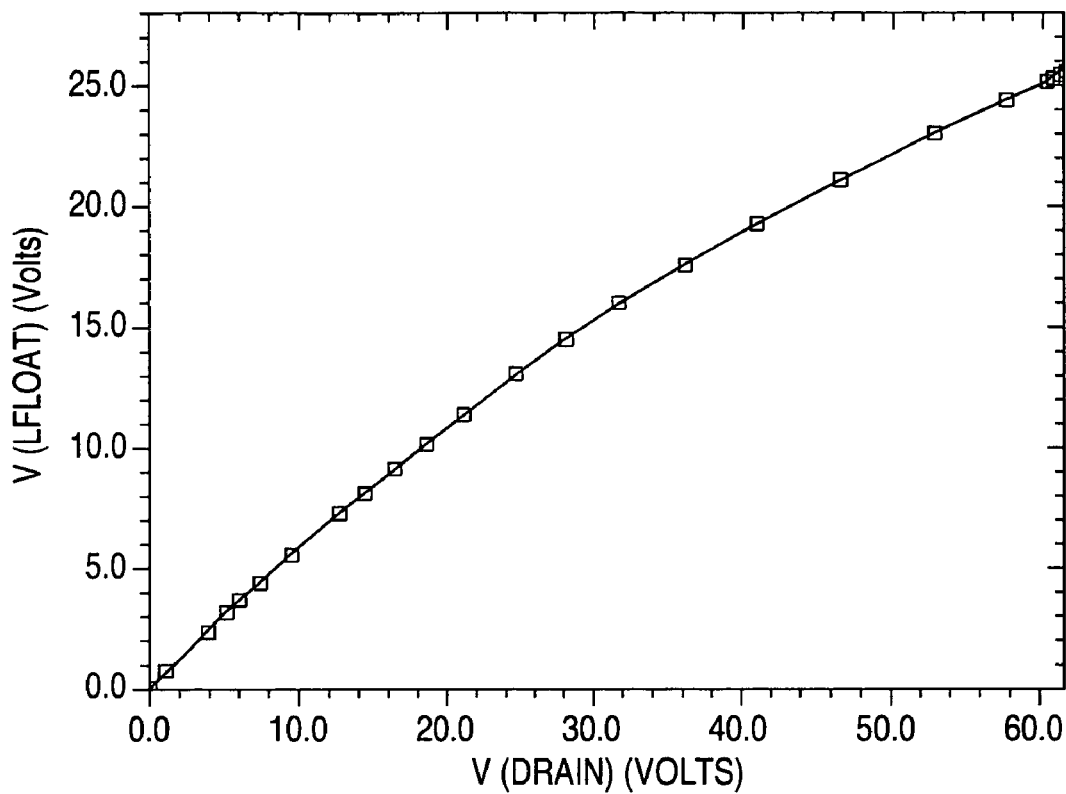
FIG. 6 is a graph of the floating trench voltage vs. drain voltage for the simulated device of FIG. 2, illustrating a coupling ratio of approximately 2/5.

FIG. 4 is a graph of the drain current (Id) vs. gate voltage (Vg) with Vds=1V for the device of FIG. 2. FIG. 5 is a graph of drain current (Id) vs. drain voltage, showing that breakdown occurs at slightly higher than 60 volts. FIG. 6 is a graph of the floating poly voltage (Vfloat) vs. drain voltage, showing a coupling ratio of about 2/5.

Computer simulation shows that a drift region consisting of two epi layers with a phosphorus doping concentration of 2.3e16 and 3e16/cm$^3$ (top layer and bottom layer, respectively) and a total thickness of 3 um is capable of achieving a breakdown voltage of 62 volts and a specific on-resistance of 10.7 mΩ-mm$^2$.

Figure 7:
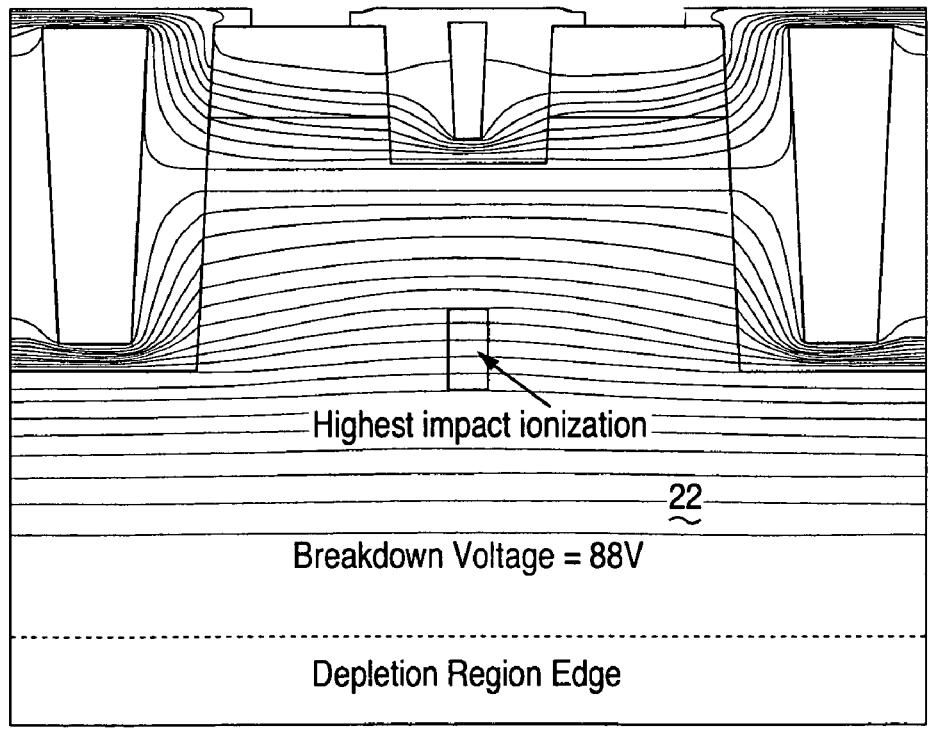
FIG. 7 illustrates an embodiment where breakdown occurs near the middle of the drift region rather than near a dielectric surface. The oxide liner is much thicker than required in order to contrast the technique with an Oxide Bypassed technique.

With optimized epi layers for a particular device configuration, breakdown can be forced to occur in the middle of the drift region, at a depth deeper than the floating trench depth, as shown in FIG. 7. This bulk breakdown characteristic further ensures device ruggedness by moving breakdown away from a dielectric surface that may cause breakdown walking and/or possible injection of hot carriers into the floating poly, perturbing the field shaping effect.

Figure 8:
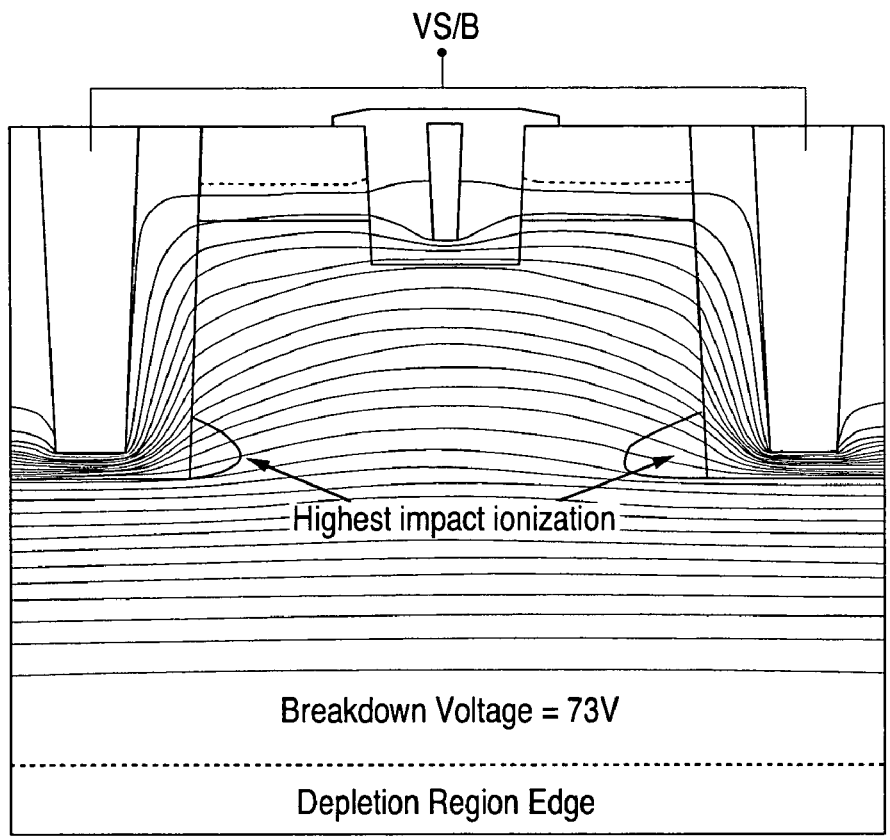
FIG. 8 illustrates a computer simulation of an Oxide Bypassed technique with the trenches tied to the source/body voltage (0 volts), but with other parameters identical to that of FIG. 7, to show the increased breakdown voltage of the invention of FIG. 7 compared to the Oxide Bypassed technique.

The enhanced performance for the Floating Trench Technique can be further illustrated by comparing it with the Oxide-Bypassed technique, where the field-shaping poly is physically and electrically connected by metal to the source/P-type body metal as shown in FIG. 8. The design of FIG. 8 was created by the present inventor for the comparison, although the coupling of poly-filled trenches to a fixed voltage is prior art. The devices of FIGS. 7 and 8 have identical device parameters including oxide thickness (in the present example the oxide thickness used for the floating trench is much higher than required), epi thickness/resistivity, and trench/trench spacing, etc. Breakdown voltage for the floating trench technique is ~15V higher than that using the Oxide-Bypassed method, with the Oxide-Bypassed breakdown limited by the dielectric thickness in the field-shaping region. The dielectric thickness in the Oxide-Bypassed trench has to be thick enough to sustain a full-scale voltage drop between source and drain in the blocking state, where the dielectric thickness of the floating technique need only sustain the difference between the floating poly potential and drain bias. Equivalent breakdown for an Oxide-Bypassed device can be achieved by thickening both sidewall and bottom trench dielectric, but at the expense of increasing cell pitch and thus increasing specific on-resistance.

Figure 9:
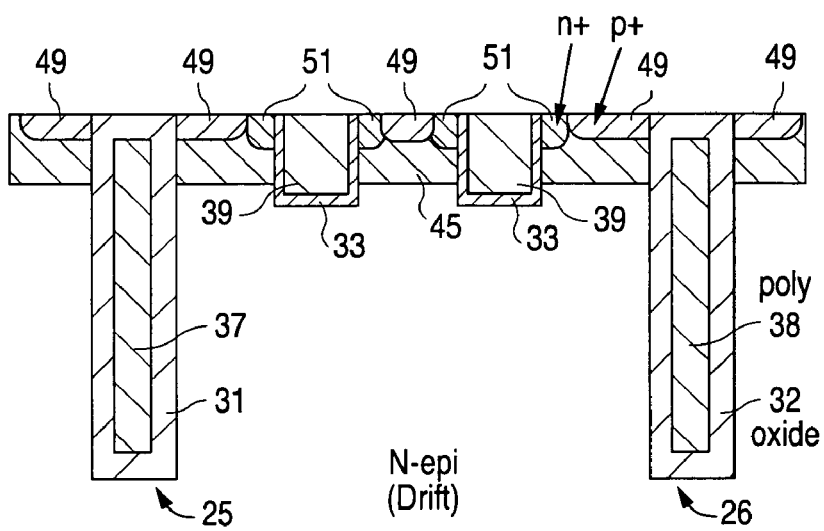
FIG. 9 illustrates how multiple DMOS transistors in parallel may be located between the floating trenches.
Figure 9:
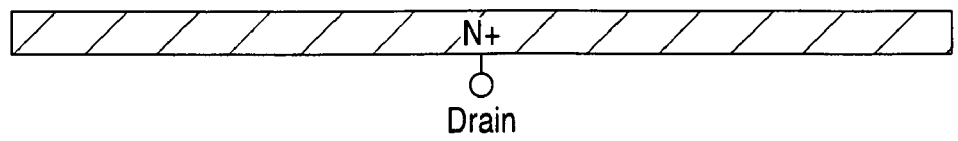

The specific on-resistance can be further reduced by integrating more than one TDMOS transistor between the floating field-shaping trenches as depicted in FIG. 9. The structure of FIG. 9 may only be a small portion of a power DMOS device. One important design parameter is the spacing between the trenches 25 and 26. Too wide a spacing will lead to insufficient field shaping effect, resulting in incomplete depletion between the floating trenches in the drift region, causing lower breakdown to occur. Optimizing drift-epi resistivity and thickness is important to achieve high breakdown voltage.

Figure 10:
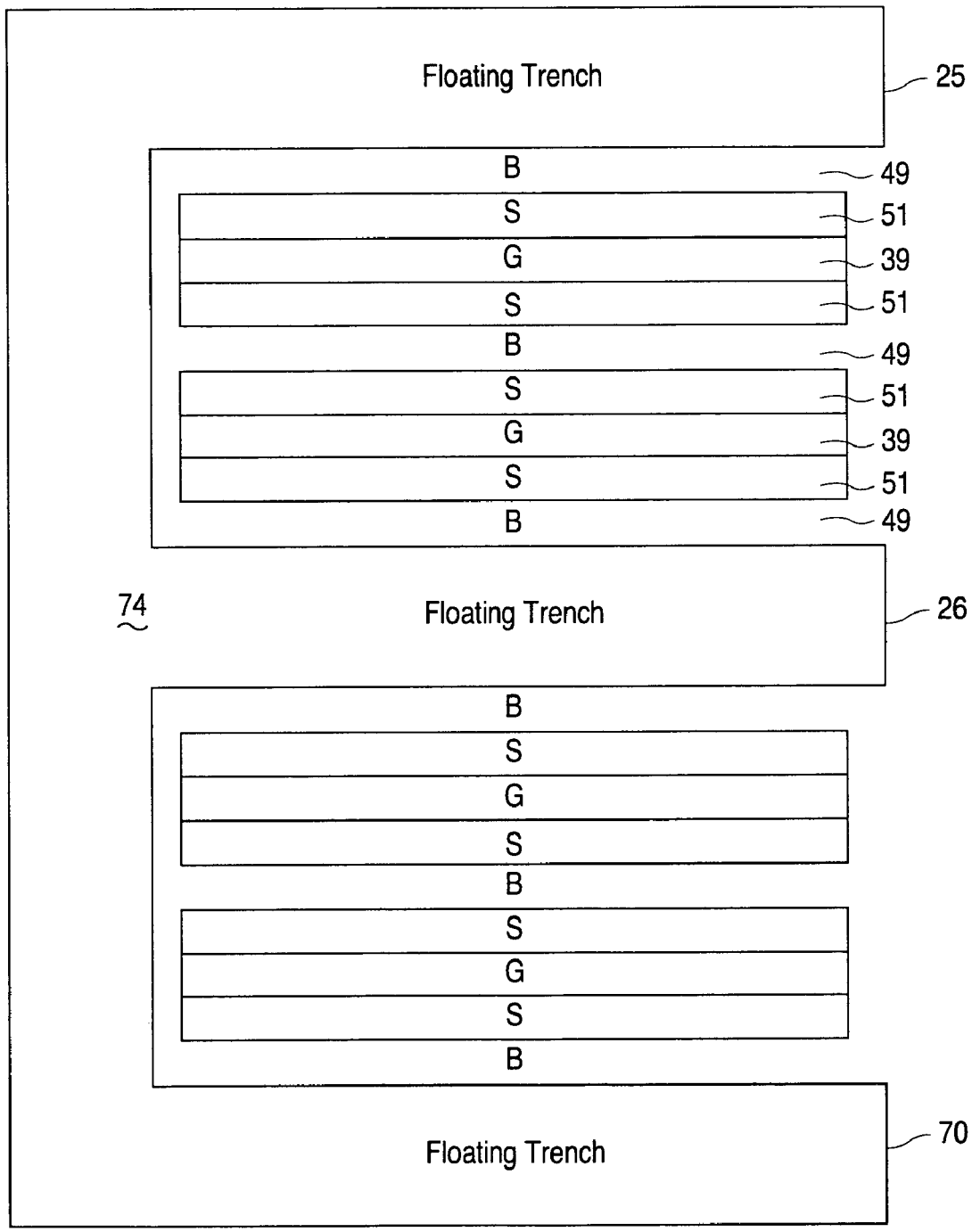
FIG. 10 is a top down view of a substrate illustrating multiple floating trenches within an array of DMOS transistors, similar to the transistors of FIG. 9, for increasing the breakdown voltage.

FIG. 10 is a top down view of a portion of a power device using the structure of FIG. 9, where many TDMOS transistors in a two-dimensional array are connected in parallel. Only four transistors are shown for simplicity. There may be more than one hundred individual transistors in an array. The poly in all the deep trenches 25, 26, and 70 may be connected together by a poly connector 74. Alternatively, the poly is not connected together. Each pair of trenches opposes a number of TDMOS transistors. More than two transistors may be opposed by a pair of floating trenches.

In a preferred embodiment, the floating trenches completely surround the perimeter of the array (occurring out of the view of FIG. 10). In other words, a floating trench similar to trench 74 would connect together the right ends of trenches 25, 26, and 70.

Figure 11:
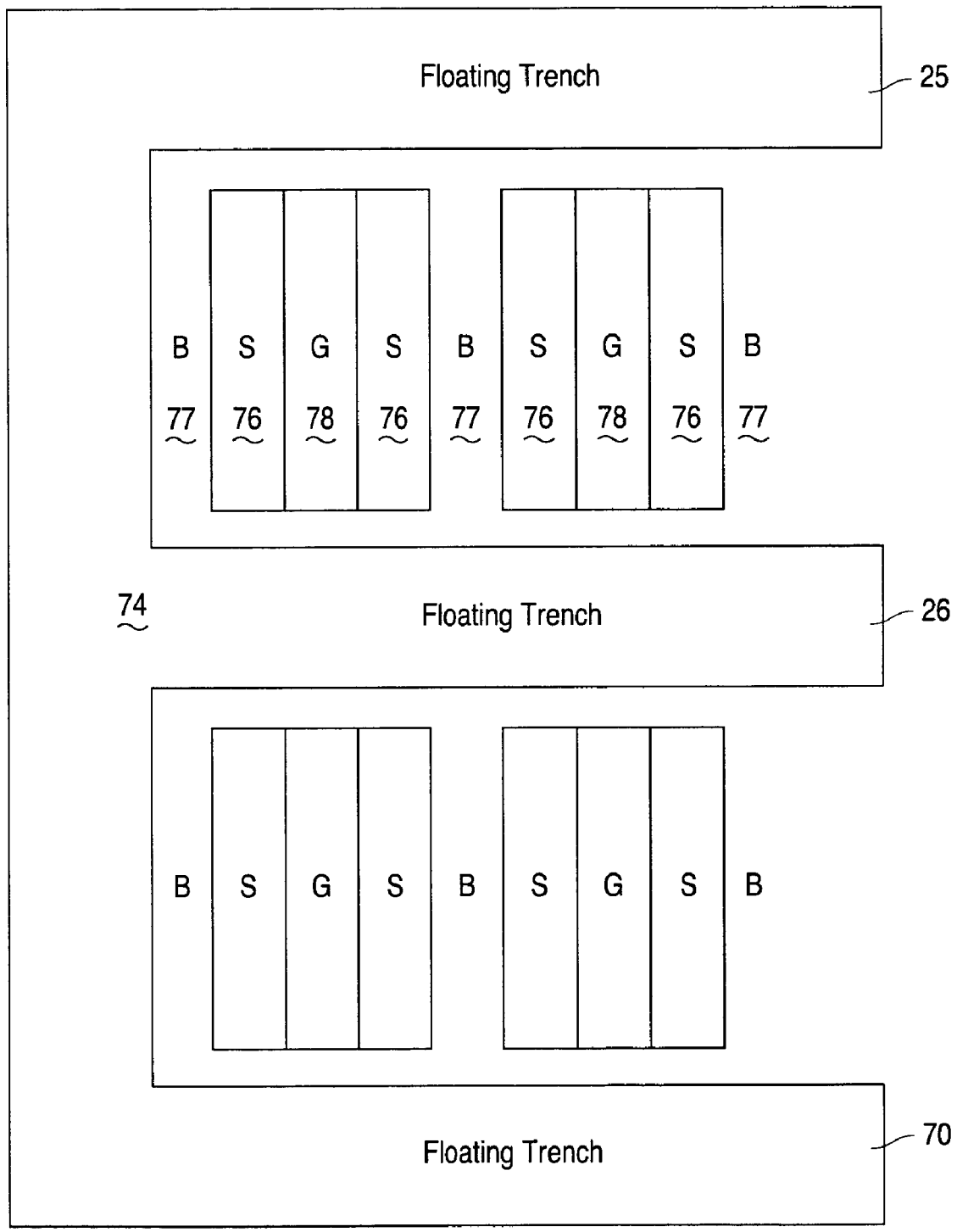
FIG. 11 is a top down view of a substrate illustrating multiple floating trenches within an array of DMOS transistors, where the transistors are rotated 90 degrees compared to the transistors of FIG. 10, for increasing the breakdown voltage.

The TDMOS transistor sources, bodies, and gates in FIG. 10 are shown extending horizontally along the horizontal trenches. The width dimensions of the gates are parallel to the floating trenches. In FIG. 11, the sources 76, bodies 77, and gates 78 extend vertically along the horizontal trenches. The width dimensions of the gates are perpendicular to the floating trenches. There may be any number of floating trenches and transistors in the array, and the floating trenches completely encircle the transistors, as in FIG. 10.

An outer poly-filled trench (not shown) may surround the entire structure to reduce field crowding due to edge effects.

Since the field-shaping poly in the trenches is going to float to some potential higher than the source/P-body potential when the device is operated in the reverse blocking mode, there should not be a source region on the field-shaping side of the active region, as shown in FIGS. 9 and 10. If the source region gets overlapped vertically by the field-shaping poly, or if the depletion region from the floating poly expands far enough to touch the source region at a high bias, undesired leakage from a parasitic N-channel MOSFET will turn on, drawing current from source to drain when the device is supposed to be in the off-state. The parasitic N-channel MOSFET comprises the intrinsic N+ source region, bottom drain electrode, and floating trench poly gate. A more positive potential on the floating poly with respect to the source/P-body will cause depletion in the P-type diffused body, and when inversion occurs at a higher bias, a conducting channel is formed along the trench sidewall, causing leakage current in the off-state. This problem can be eliminated by the absence of a source region on both sides of the field-shaping region, where a body region surrounds the active region.

Figure 12:
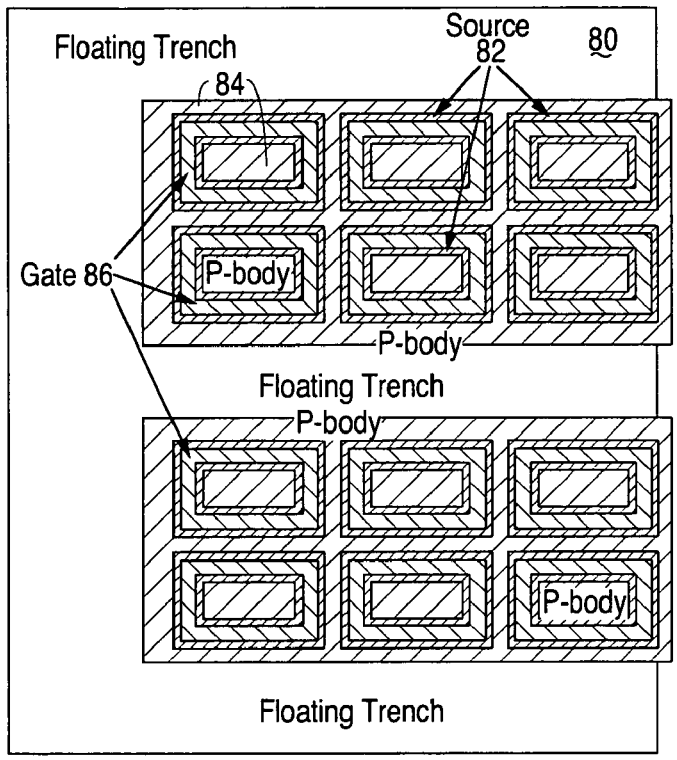
FIG. 12 is a top down view of a cellular layout using rectangular cells with a floating trench surrounding a plurality of the cells.

FIG. 12 illustrates a portion of a cellular layout of DMOS transistors surrounded by floating trenches 80. The cells are rectangular. The floating trench portion enclosing the right side of the array is not shown. Shown are source regions 82, P-body regions 84, and gates 86. Although the gates 86 shown are in trenches (like in the trench MOSFET of FIGS. 1 and 2), the gates may also be formed over the surface of the substrate, as shown by the VMOS of FIG. 1. In another embodiment a floating trench surrounds each individual transistor.

Figure 13:
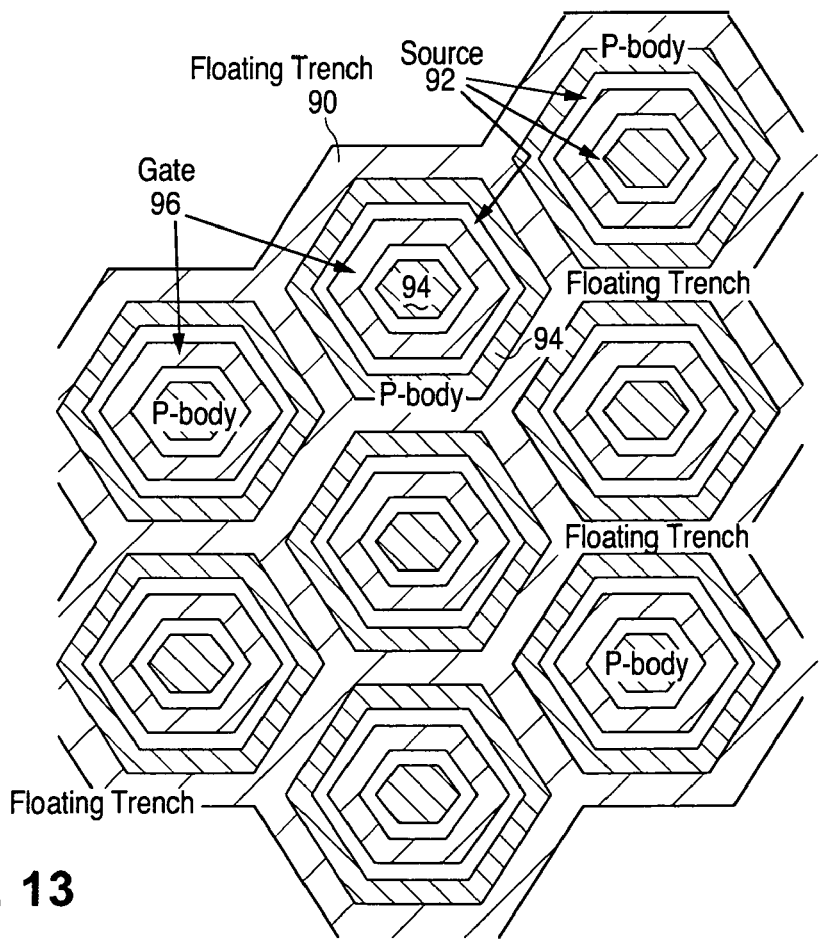
FIG. 13 is a top down view of a cellular layout using hexagonal cells with a floating trench surrounding a plurality of the cells.

FIG. 13 illustrates a portion of a cellular layout of DMOS transistors surrounded by floating trenches 90. The cells are hexagonal. Each cell is surrounded by a floating trench. Shown are source regions 92, P-body regions 94, and gates 96. The gates 96 may be in trenches or over the surface of the substrate, as shown in FIG. 1.

Figure 14:
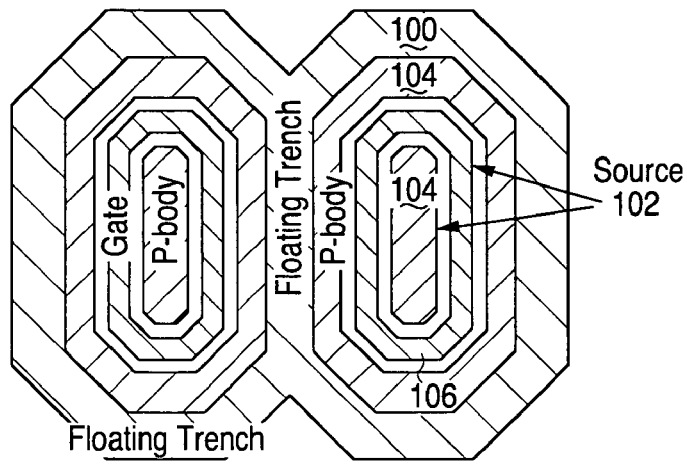
FIG. 14 is a top down view of a cellular layout using octagonal cells with a floating trench surrounding a plurality of the cells.
Figure 14:
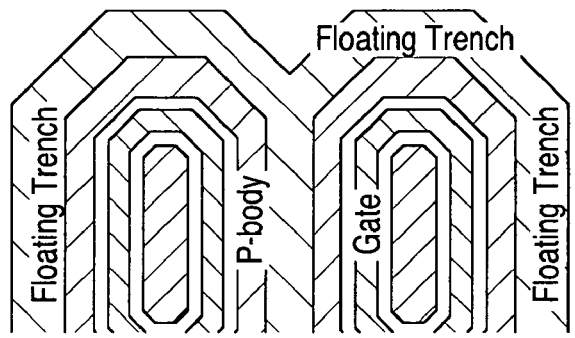

FIG. 14 illustrates a portion of a cellular layout of DMOS transistors surrounded by floating trenches 100. The cells are octagonal. Each cell is surrounded by a floating trench. Shown are source regions 102, P-body regions 104, and gates 106. The gates 106 may be in trenches or over the surface of the substrate, as shown in FIG. 1.

Figure 15:
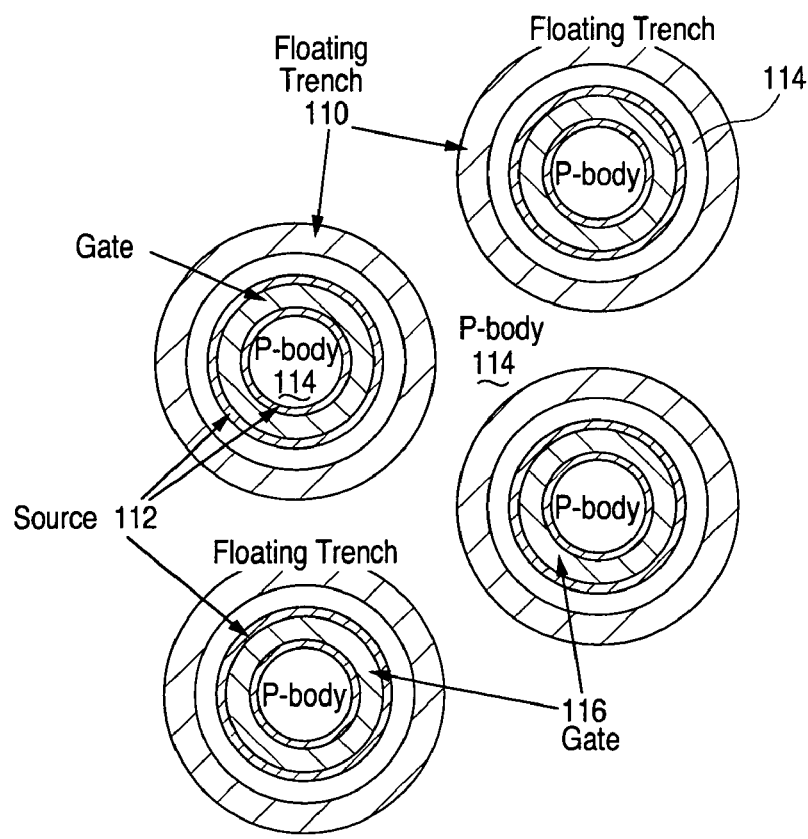
FIG. 15 is a top down view of a cellular layout using circular cells with a floating trench surrounding a plurality of the cells.

FIG. 15 illustrates a portion of a cellular layout of DMOS transistors surrounded by floating trenches 110. The cells are circular. The cells may also be oval. Each cell is surrounded by a floating trench. Shown are source regions 112, P-body regions 114, and gates 116. The gates 116 may be in trenches or over the surface of the substrate, as shown in FIG. 1.

In the cellular embodiments of FIGS. 10-15, the floating trenches surrounding the cells are opposing trench portions that create a depletion region in the drift region that extends laterally and merges under the gate to increase the breakdown voltage. Each opposing portion of a continuous trench (such as opposing sides of a hexagonal trench) is considered to be an opposing trench portion for purposes of the present description. Similarly, for circular or oval floating trenches, opposing sides of the circular trench are considered to be opposing trench portions. It is understood that the geometric patterns describe may not be perfect geometrical shapes when actually fabricated, but may be substantially similar to the intended geometric shape.

Although the preferred embodiment substantially totally depletes the drift region below the gate at near the maximum voltage rating of the transistor, increased breakdown is achieved by even small amounts of depletion under the gate as long as the lateral depletion regions are merged. The high depletion levels described may be those existing at slightly below the maximum voltage rating (i.e., breakdown voltage rating) of the transistors.

While particular embodiments of the present invention have been shown and described, it would be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A transistor structure formed in a substrate comprising:
a vertical DMOS transistor comprising a source, a drain, a body region, a gate, and a drift region between the drain and the body region, a threshold voltage applied to the gate causing a generally vertical current to flow between the source and drain with respect to a horizontal surface of the substrate; and
opposing floating trench portions, comprising a conductive or semiconductor material that has no external electrical contact and being isolated from any surrounding material by a dielectric, the trench portions having a generally vertical depth dimension with respect to the horizontal surface of the substrate, and the transistor gate being in between opposing floating trench portions,
wherein the opposing floating trench portions are arranged such that operating voltages applied to the body region and the drain capacitively couple a potential to the opposing floating trench portions, the potential being in between the drain voltage and the body region voltage, which creates a depletion region that merges in the drift region from opposing floating trench portions at a certain drain bias.

2. The structure of claim 1 wherein the DMOS transistor comprises a two-dimensional array of DMOS transistors arranged in rows, each DMOS transistor comprising a source, a drain, a body region, a gate, and a drift region between the drain and the body region, wherein the opposing floating trench portions run along a plurality of rows of DMOS transistors, there being at least a portion of a row of DMOS transistors between a pair of opposing floating trench portions.

3. The structure of claim 1 wherein the DMOS transistor comprises at least a row of DMOS transistors, each DMOS transistor comprising a source, a drain, a body region, a gate, and a drift region between the drain and the body region, the gate having a width dimension substantially perpendicular to a row of DMOS transistors, wherein the opposing floating trench portions run on opposite sides of each row, there being at least a portion of a row of DMOS transistors between a pair of opposing floating trench portions, with the gate width dimension substantially perpendicular to the opposing floating trench portions.

4. The structure of claim 1 wherein the DMOS transistor comprises at least a row of DMOS transistors, each DMOS transistor comprising a source, a drain, a body region, a gate, and a drift region between the drain and the body region, the gate having a width dimension substantially parallel to a row of DMOS transistors, wherein the opposing floating trench portions run on opposite sides of each row, there being at least a portion of a row of DMOS transistors between a pair of opposing floating trench portions, with the gate width dimension substantially parallel to the opposing floating trench portions.

5. The structure of claim 1 wherein the drain is a heavily doped region of a first conductivity type formed on a bottom surface of the substrate, where the source is formed on a top surface of the substrate.

6. The structure of claim 5 wherein the drift region comprises a portion of a layer under the gate, the drift region being more lightly doped than the drain region.

7. The structure of claim 6 wherein the opposing floating trench portions completely deplete the drift region under the gate at a certain drain bias.

8. The structure of claim 1 wherein the gate is formed of a conductive material in a trench extending substantially vertically into the substrate, and being shallower than the opposing floating trench portions.

9. The structure of claim 1 wherein the gate overlies a top surface of the substrate.

10. The structure of claim 1 wherein each floating trench portions comprises an oxide liner and is at least partially filled with polysilicon that has no external electrical contact.

11. The structure of claim 1 wherein the source, drift, and drain are regions of a first conductivity type, and the body region is of a second conductivity type.

12. The structure of claim 1 wherein the drift region is an epitaxial layer, wherein each trench portion comprises an oxide liner and is at least partially filled with polysilicon that has no external electrical contact, and being capacitively coupled between the body region and the drift region, causing a potential on the trench portions to be in between the drain voltage and the body region voltage, to create a depletion region that merges in the drift region from opposing floating trench portions at a certain drain bias.

13. The structure of claim 1 wherein the spacing between opposing floating trench portions is set to create a depletion region in the drift region that is able to merge from each opposing floating trench portion at a drain bias voltage that is at or below a maximum rated voltage for the DMOS transistor.

14. The structure of claim 1 wherein the opposing floating trench portions completely encircle one or more individual DMOS transistors in an array of DMOS transistors.

15. The structure of claim 14 wherein the floating trench portions form a rectangle.

16. The structure of claim 14 wherein the floating trench portions form a substantially hexagonal shape surrounding one or more DMOS transistors having a substantially hexagonal shape.

17. The structure of claim 14 wherein the floating trench portions form a substantially octagonal shape surrounding one or more DMOS transistors having a substantially octagonal shape.

18. The structure of claim 14 wherein the floating trench portions form a substantially circular shape surrounding one or more DMOS transistors having a substantially circular shape.

19. The structure of claim 1 further comprising a metal layer overlying and insulated from the floating trench portions, the metal layer being connected to a source or body region voltage, the floating trench portions being capacitively coupled to the metal layer.

20. A method comprising:
providing a vertical DMOS transistor structure formed of a plurality of DMOS transistors connected in parallel, each DMOS transistor comprising a source, a drain, a body region, a gate, and a drift region between the drain and the body region, a threshold voltage applied to the gate causing a generally vertical current to flow between the source and drain with respect to a horizontal surface of the substrate, the transistor structure also having opposing floating trench portions, comprising a conductive or semiconductor material that has no external electrical contact and being isolated from any surrounding material by a dielectric, the trench portions having a generally vertical depth dimension with respect to the horizontal surface of the substrate, the opposing trench portions being proximate to at least one DMOS transistor with the transistor gate being in between opposing floating trench portions; and
applying voltages to the drain and body region such that a potential is capacitively coupled to the opposing floating trench portions, the potential being in between the drain voltage and body region voltage, each opposing floating trench portion creating a depletion region in the drift region that merges in the drift region of the at least one DMOS transistor at a certain drain bias.

21. The method of claim 20 wherein the opposing floating trench portions completely encircle one or more individual DMOS transistors in an array of DMOS transistors.

22. The method of claim 21 wherein the floating trench portions form a rectangle.

23. The method of claim 21 wherein the floating trench portions form a substantially hexagonal shape surrounding one or more DMOS transistors having a substantially hexagonal shape.

24. The method of claim 21 wherein the floating trench portions form a substantially octagonal shape surrounding one or more DMOS transistors having a substantially octagonal shape.

25. The method of claim 21 wherein the floating trench portions form a substantially circular shape surrounding one or more DMOS transistors having a substantially circular shape.

26. The method of claim 20 wherein the at least one DMOS transistor comprises at least one row of DMOS transistors.

27. The method of claim 20 wherein the drift region comprises a portion of an epitaxial layer under the gate.

28. The method of claim 20 wherein the opposing floating trench portions completely deplete the drift region under the gate at a certain drain bias.

29. The method of claim 20 wherein the DMOS transistor includes a gate formed of a trench at least partially filled with a conductive material extending substantially vertically into the substrate and being shallower than the opposing floating trench portions.

30. The method of claim 20 wherein the spacing between opposing floating trench portions is set to create a depletion region in the drift region that is able to merge from each opposing floating trench portion at a drain bias voltage that is at or below a maximum rated voltage for the DMOS transistor.

* * * * *